(12) United States Patent
Beene

(10) Patent No.: US 7,400,151 B2
(45) Date of Patent: Jul. 15, 2008

(54) CONNECTOR CROSSTALK AND RETURN LOSS CANCELLATION

(75) Inventor: Gerald Wayne Beene, Southlake, TX (US)

(73) Assignee: Avo Multi-Amp Corporation, Dallas, TX (US)

(*) Notice: Subject to any disclaimer, the term of this patent is extended or adjusted under 35 U.S.C. 154(b) by 330 days.

(21) Appl. No.: 11/188,534

(22) Filed: Jul. 25, 2005

(65) Prior Publication Data

US 2007/0030010 A1 Feb. 8, 2007

(51) Int. Cl.
- G01R 31/11 (2006.01)
- G01R 31/02 (2006.01)
- G01R 27/28 (2006.01)

(52) U.S. Cl. .................. 324/534; 324/533; 324/543; 324/628

(58) Field of Classification Search .................. 324/86, 324/533, 534, 543, 628
See application file for complete search history.

(56) References Cited

U.S. PATENT DOCUMENTS

| | | | |
|---|---|---|---|
| 5,467,021 A | 11/1995 | Adamian et al. | |
| 5,532,603 A | 7/1996 | Bottman | 324/628 |
| 5,559,427 A | 9/1996 | Hinds et al. | |
| 5,629,628 A | 5/1997 | Hinds et al. | |
| 5,677,633 A | 10/1997 | Moser et al. | |
| 5,698,985 A | 12/1997 | Bottman | 324/628 |
| 5,714,885 A | 2/1998 | Lulham | |
| 5,846,236 A | 12/1998 | Lindenmeier et al. | |
| 6,022,347 A | 2/2000 | Lindenmeier et al. | |
| 6,041,041 A | 3/2000 | Ramanathan et al. | |
| 6,388,437 B1 | 5/2002 | Wolski et al. | |
| 6,397,159 B1 | 5/2002 | Richardson | |
| 6,522,152 B1 | 2/2003 | Tonti et al. | 324/628 |
| 6,611,147 B2 | 8/2003 | White et al. | |
| 6,823,283 B2 | 11/2004 | Steger et al. | |
| 6,847,213 B2 | 1/2005 | Renken et al. | |
| 7,035,959 B2 | 4/2006 | Umezu et al. | |
| 7,053,830 B2 | 5/2006 | Krumm et al. | |
| 7,165,005 B2 | 1/2007 | Steger et al. | |
| 7,178,561 B2 | 2/2007 | Memmott et al. | |
| 7,187,861 B2 | 3/2007 | Ruchet | |
| 2003/0074489 A1 | 4/2003 | Steger et al. | |
| 2004/0113604 A1 | 6/2004 | Renken et al. | 324/76.52 |
| 2004/0263388 A1 | 12/2004 | Krumm et al. | |
| 2005/0044260 A1 | 2/2005 | Abramson et al. | |
| 2005/0270236 A1 | 12/2005 | Krumm et al. | |
| 2007/0154212 A1 | 7/2007 | Ruchet et al. | |

*Primary Examiner*—Timothy J Dole
(74) *Attorney, Agent, or Firm*—Conley Rose, P.C.; J. Robert Brown, Jr.

(57) ABSTRACT

A device for testing data communications cabling. The device consists of a signal generator that can generate a test signal to test the data communications cabling and a receiving component that can receive a reflected signal produced by reflection of the test signal from the data communications cabling including any reactive point source disturbance that may exist on the cabling. The receiving component can determine characteristics of the reflected signal by analyzing the phase rotation and amplitude of the reflected signal. The device can also include a cancellation generator that can generate a cancellation function based on the characteristics of the reflected signal. The cancellation function can substantially negate a portion of the reflected signal.

21 Claims, 8 Drawing Sheets

CONNECTOR CROSSTALK AND RETURN LOSS CANCELLATION

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

This invention relates in general to the field of devices for testing conductors of electromagnetic signals and more specifically, but not by way of limitation, to a system and method for canceling the effects of reactance caused by connectors in the conductors.

BACKGROUND OF THE INVENTION

Figure 1:
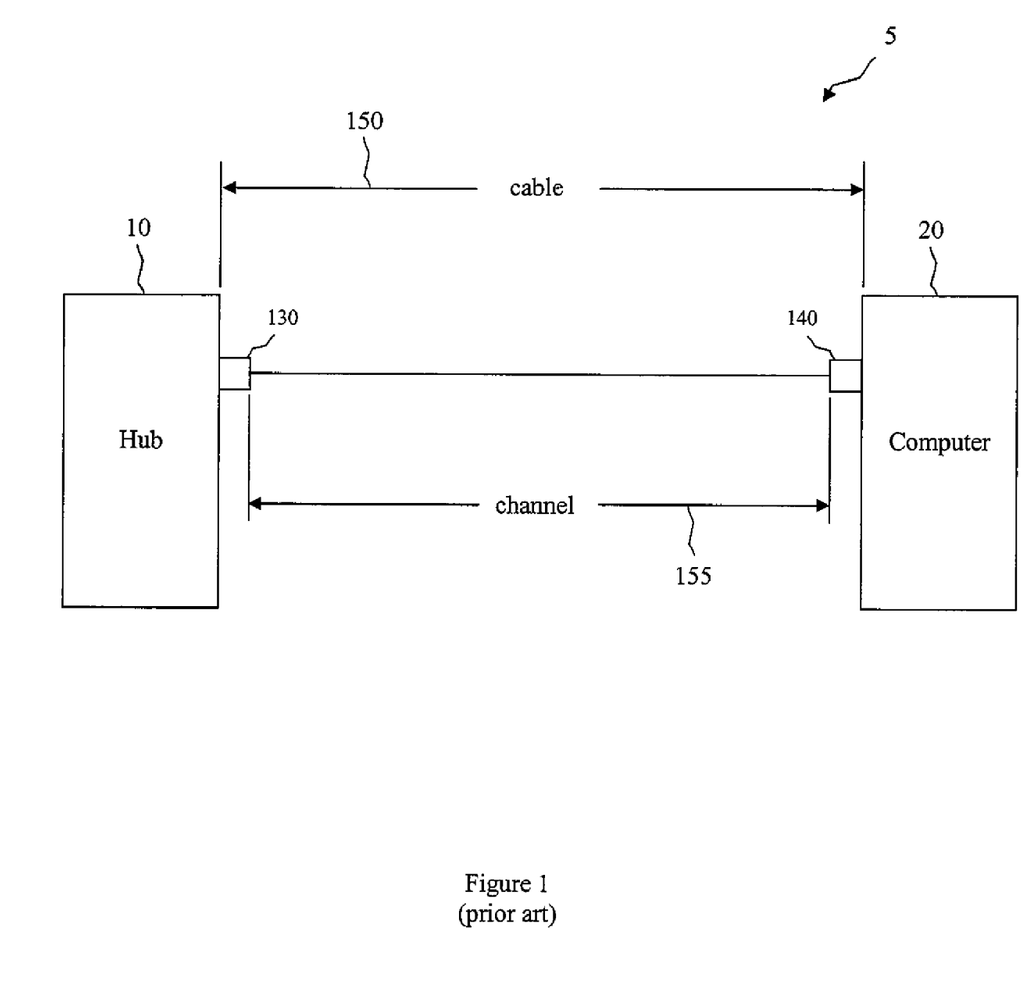
FIG. 1 illustrates a portion of a typical prior art computing network.

A local area network (LAN) or a similar computing network typically consists of one or more server computers connected through conductive cabling to one or more client computers. FIG. 1 illustrates a portion 5 of such a network. A hub 10, a router, or a similar device is coupled through cable 150 to a desktop computer 20 or a similar device. The cable 150 might include lengths of twisted pair cables, patch cords, and other standard conducting cables. The hub 10 is coupled to the cable 150 by a first connector 130 and the computer 20 is coupled to the cable 150 by a second connector 140.

Figure 2:
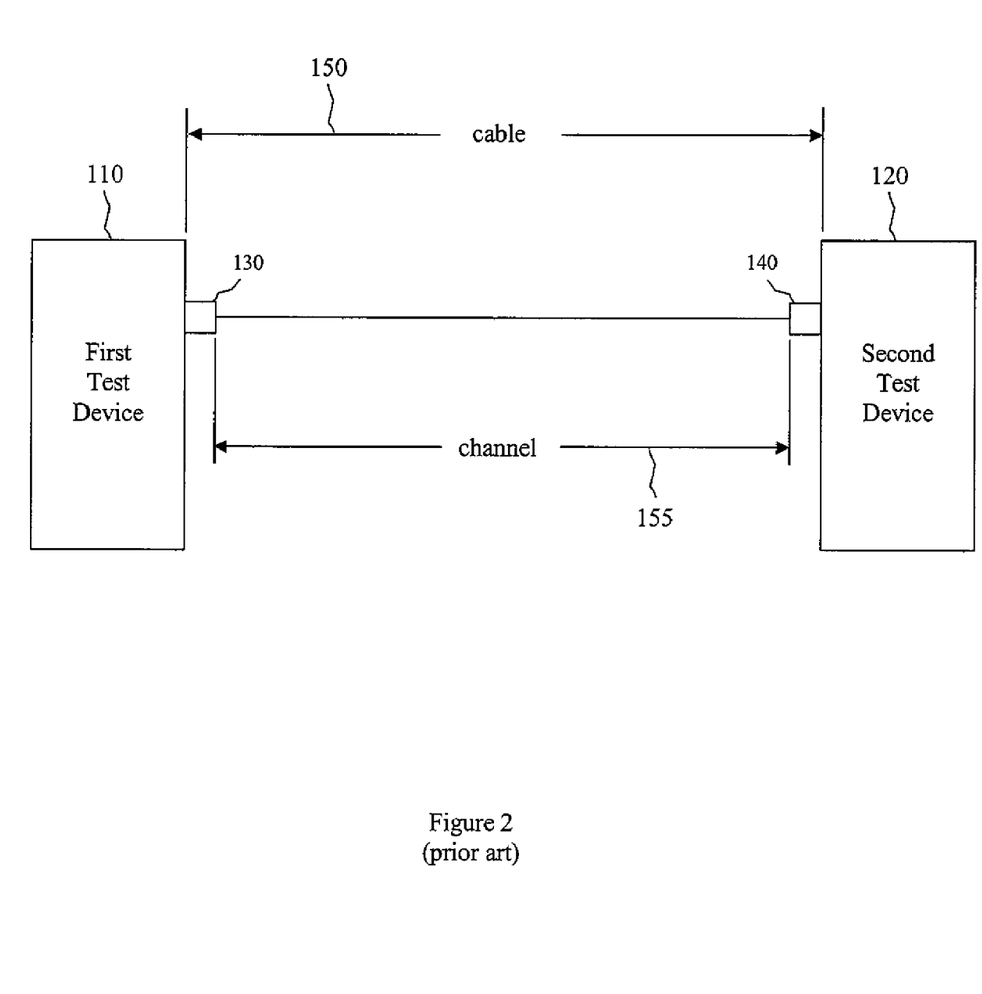
FIG. 2 illustrates a prior art system for testing a computing network.

Testing can be done to verify the integrity of the cable 150 by replacing the hub 10 and the computer 20 with test devices, as shown in FIG. 2. A first test device 110 transmits a test signal through the cable 150 to a second test device 120. The test signal is typically a radio frequency signal that is varied between a lower frequency and a higher frequency. The second test device 120 receives the test signal response and analyzes it to determine cable gain or far-end crosstalk at each frequency. Cable gain (insertion gain) is always less than one because the cable always exhibits loss. In some cases, the test signal is returned through the cable 150 to the first test device 110, which then performs the analysis.

The test equipment may be based on a pulse response, where the system is excited by a pulse and the time domain of the system is then converted to the frequency domain by use of Fourier transforms to obtain the frequency response of the system.

The test device 110 or 120 performing the analysis can measure several different parameters such as Return Loss and near-end crosstalk (NEXT). Return Loss is expressed as the ratio of the transmitted signal power to the reflected signal power and is usually expressed in dB. NEXT is the ratio of the transmitted signal power on one channel to the received crosstalk power on another channel at the same location (i.e., the same end of the cable) and is usually expressed in dB. Other parameters that might be examined include attenuation and equal level far-end crosstalk.

The connectors 130 and 140 can cause Return Loss, NEXT, and other effects by introducing capacitance, inductance, or both into the test signal response. When both capacitance and inductance are present and physically located together, they can be combined into a single point source equivalent reactance, which may be capacitive or inductive. The connectors 130 and 140 and other point sources of reactance that might be present in the cable 150 can be referred to as reactive point source disturbances (RPSDs).

Various organizations publish standards and guidelines describing how LAN testing should be conducted. These guidelines typically require that only the portion of the cable 150 known as the channel 155, which runs between but does not include connectors 130 and 140, should be analyzed. That is, the effects of the connectors 130 and 140 are not to be included in the analysis of the test signal response. This can complicate the test procedures because the test signal must pass through the connectors 130 and 140. Any reactance introduced by the connectors 130 and 140 must be accounted for in the analysis of the test signal response.

SUMMARY OF THE INVENTION

An embodiment of the invention provides a device for testing data communications cabling. The device consists of a signal generator that can generate a test signal to test the data communications cabling and a receiving component that can receive a reflected signal produced by reflection of the test signal from the data communications cabling including any reactive point source disturbance that exists on the cabling. The receiving component can determine characteristics of the reflected signal by analyzing the phase rotation (delay) and amplitude of the reflected signal.

An alternative embodiment provides a method for canceling the effects of a reactive point source disturbance in the resulting data set. The method consists of identifying an approximate location of the reactive point source disturbance, sending a varying-frequency test signal to a cabling system that includes the reactive point source disturbance, receiving a test signal response from the cabling system, determining characteristics of the test signal response near the approximate location of the reactive point source disturbance, generating a correction function for the reactive point source disturbance based on the characteristics of the test signal response and cable gain, and subtracting the correction function from the test signal response to create a corrected test signal response that substantially cancels the effects of the reactive point source disturbance.

Another alternative embodiment provides a device for testing a data communication cable. The device consists of a signal source, an analysis component, a correlation component, and a generation component. The signal source can send a test signal of varying frequency through the cable. The analysis component can receive a test signal response produced by a reflection of the test signal from the cable, determine a set of reflection or transmission coefficients for the frequencies in the test signal response, determine an imaginary summation over selected frequencies for the set of reflection or transmission coefficients, and determine a greatest peak in the imaginary summation. The correlation component can correlate a location of the greatest peak to a location of a reactive point source disturbance and correlate a greatest peak amplitude to a magnitude of a reactive point source disturbance reactance. The generation component can use the reactive point source disturbance location and the reactive point source disturbance reactance amplitude to generate a reactive point source disturbance correction function, and can combine the reactive point source disturbance correction function with the test signal response to create a corrected test signal response.

These and other features and advantages will be more clearly understood from the following detailed description taken in conjunction with the accompanying drawings and claims.

BRIEF DESCRIPTION OF THE DRAWINGS

For a more complete understanding of the presentation and the advantages thereof, reference is now made to the following brief description, taken in connection with the accompanying drawings and detailed description, wherein like reference numerals represent like parts.

DETAILED DESCRIPTION OF THE PREFERRED EMBODIMENTS

It should be understood at the outset that although an exemplary implementation of one embodiment of the present invention is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

When a test device places a test signal of varying frequency on a cable, any RPSDs or other impedance disturbances in the system that might be present on the cable or other components can cause a portion of the test signal to be reflected back to the test device. This returned portion of the signal can be referred to as the test signal response. An RPSD can be modeled as a reactive component of a certain magnitude located at a certain distance from a signal source. Because the RPSD is a reactance, its response will be imaginary (in phase quadrature) with the transmitted signal when extracted from the test signal response.

In an embodiment, the characteristics of the RPSDs on a cable are determined by examining a delay in the frequency domain as measured by the slope of the phase shift with respect to frequency. The test signal response is first corrected for total cable gain, which is the gain of the cable out to the RPSD and back to the receiver. This cable gain is a function of frequency and cable length. For near-end RPSDs, the cable length is approximately zero and the cable has unity gain. A frequency-dependent complex rotation is performed on the corrected test signal response at selected frequencies in the signal. The selected frequencies for complex rotation are a subset of the frequencies existing in the test signal response data. A complex rotation is a map of the form $x \to xe^{j\theta}$. $\theta$ is a real number, which corresponds to counterclockwise rotation about the origin of points in the complex plane by $\theta$ radians. The rotation is done only around a previously discovered approximate location of an RPSD to reduce the amount of computation that is performed. The search for the RPSD is typically limited to within a few nanoseconds of the expected location. Time and distance are related such that 1 foot is approximately the distance a signal travels in the cable in 1.5 nanosecond. When the imaginary results of the rotation are summed at each frequency, several peaks will occur in the summation near the delay time of the connector. The location of the largest peak indicates the location of the RPSD and the amplitude of the largest peak indicates the reactance of the RPSD. When this information is known, a correction function can be generated that replicates the effects of the RPSD. Correction functions can be created in this manner for the connectors at the near end and far end of a channel. The correction function will have a reactance part, a delay part, and a cable gain part. The reactance part defines the nature of the RPSD. The delay part defines the location along the cable of the RPSD. The cable gain part contains the compensating cable gain factor. The cable gain factor for a near-end RPSD will be essentially unity (1) because the round trip cable length is small there. These correction functions can then be subtracted from a test signal response to generate a corrected test signal response that provides test results for the channel and ignores the effects of the near and/or far-end connectors.

Figure 3:
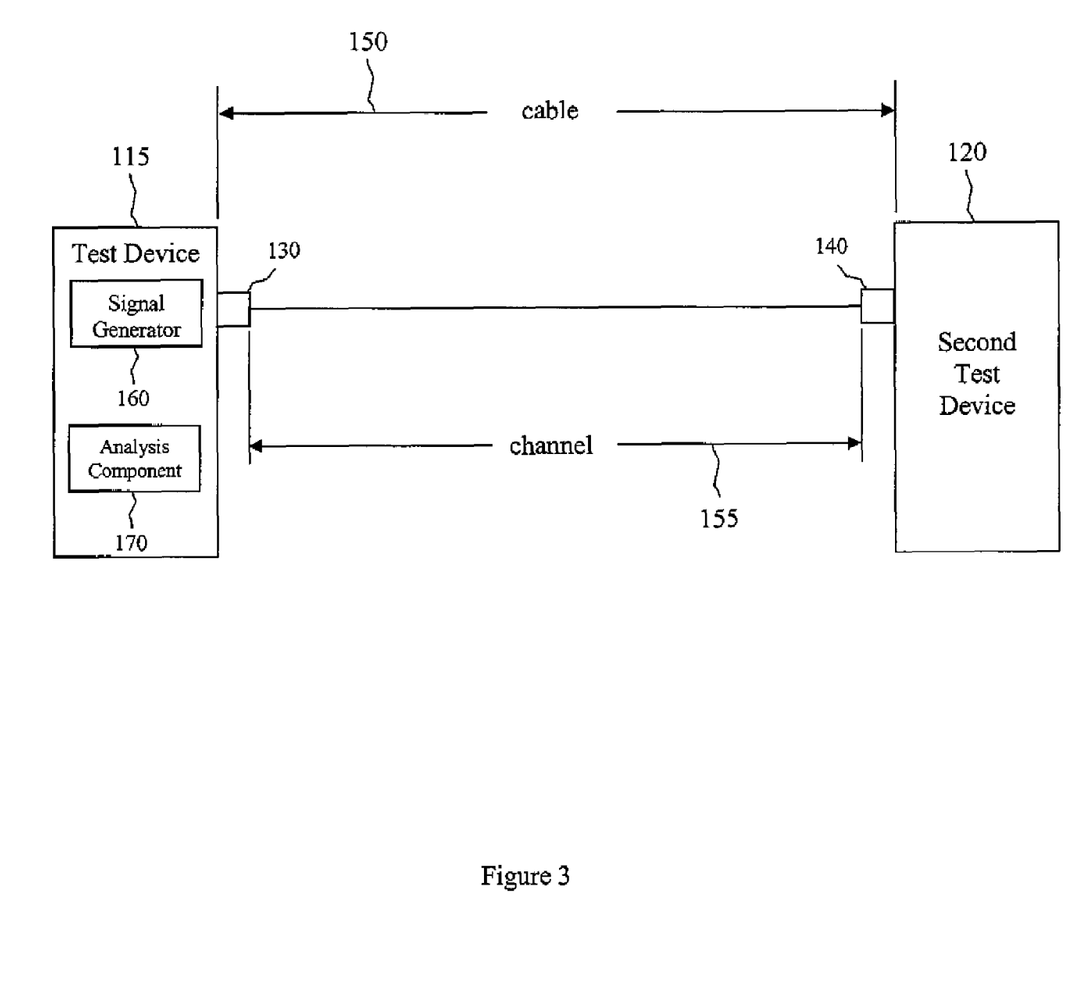
FIG. 3 illustrates a system for testing a computing network, according to an embodiment of the invention.

In the embodiment of FIG. 3, a test device 115 can be assumed to contain a signal generation source 160 at a known location in its interior. A jack can be assumed to be located at or near the exterior of the test device 115. When a plug is inserted into the jack, connector 130 is created and will hereinafter be referred to as the near-end RPSD 130. The process of canceling the effects of the near-end RPSD 130 typically begins with determining its approximate location, that is, its distance from the signal source 160. This distance would typically be known from the factory specifications of the test device 115 and could be stored in an electronic memory within the test device 115 for retrieval whenever a near-end RPSD cancellation is to be performed.

When this approximate distance is known, a mathematical analysis of the varying-frequency signal reflected from the near-end RPSD 130 can be performed to determine its exact location. Broadly speaking, the mathematical analysis examines a phase shift in a mathematical function that describes the frequencies in the reflected signal. Since the analysis can focus on the area at the near-end RPSD 130 rather than considering phase shifts over the entire length of the cable 150, the amount of time and computation needed to determine the exact location of the near-end RPSD 130 is greatly reduced. A more detailed description of the mathematical analysis follows.

Figure 4:
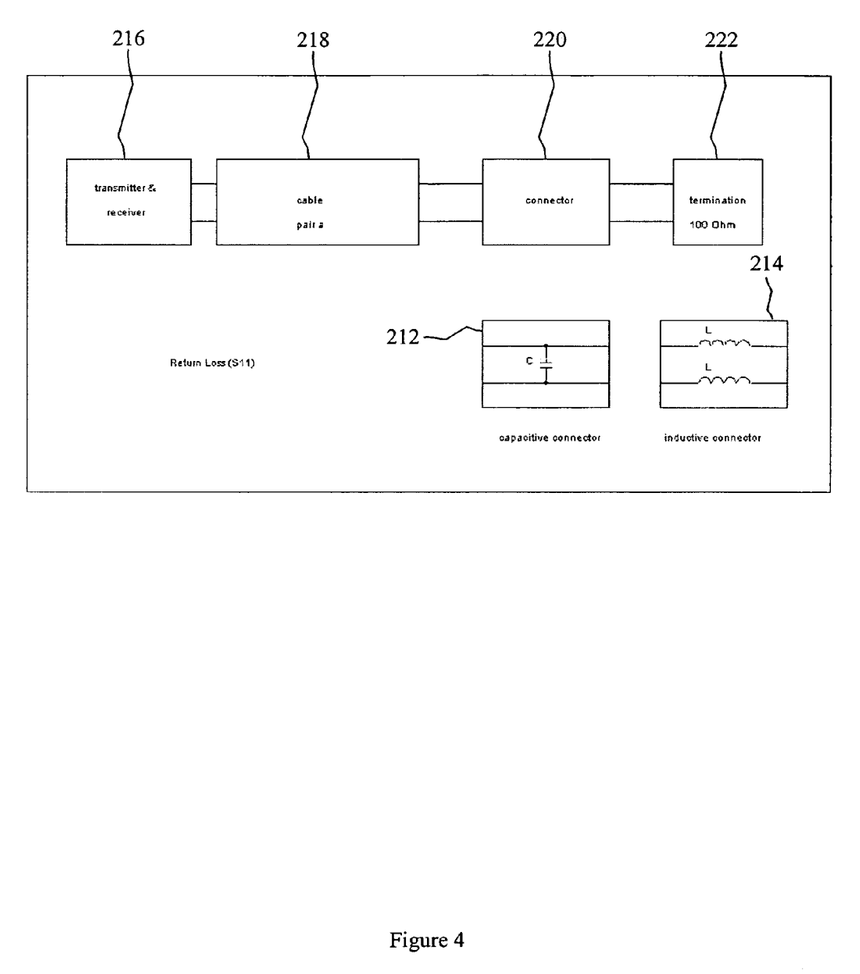
FIG. 4 illustrates a cable wire pair of a computing network cable connected to a terminated connector for S11 measurement.

As is well known in the art, RPSDs can be modeled by a set of voltage transfer functions known as "S" parameters. For example, a capacitive induced reflection coefficient can be modeled at the point of disturbance by a shunt capacitor across a termination resistor as shown in model 212 in FIG. 4. An inductive reflection coefficient can be modeled as series inductors into a termination resistor as shown in model 214 in FIG. 4. In FIG. 4, a signal is transmitted from a transmitter/receiver 216 into a cable 218, pair a, and travels to a connector 220 where some of the signal is reflected by connector mismatch and returns through the cable 218, pair a, and is received by the transmitter/receiver 216. A termination resistance 222 is present across the connector 220.

It is desired to determine the S11 which would be measured if the test were done at the point of disturbance in order to build the proper correction function. The following equation gives the relationship between a reflection coefficient (S11) at the point of disturbance and the resistance (r), the capacitance (c), and a Laplace operator (s) based on a 100 Ohm system. The resistor (r) is the termination resistance of the cable for far-end RPSDs or patch cable impedance for near-end RPSDs. In either case, (r) is approximately 100 Ohms.

$$s11(s) := \frac{\frac{1}{\frac{1}{r} + c \cdot s} - 100}{\frac{1}{\frac{1}{r} + c \cdot s} + 100}$$

Return loss is the magnitude of the reflection coefficient (S11) and is normally expressed in dB:

return_loss($s$):=−20log(|s11($s$)|)

The reflection coefficient, S11, as seen from the test instrument, can be described by adding a cable delay and loss term for signals traveling out to the RPSD and back to the receiver. The delay term is the complex exponential multiplier of the imaginary part of the equation for S11 and is one of the parameters the value of which must be determined from looking at the test signal response. The cable gain is a function of cable length and frequency. The following equation describes the imaginary part of a reflection coefficient RPSD located at T seconds delay between transmitter and receiver. The cable gain is measured by the test instrument, is a function of frequency, and is always less than one because the cable has loss. This cable gain in the equation below includes cable to the RPSD and cable from the RPSD in the equation because the signal passes through the cable in both directions.

$$\text{Im}\left[\frac{(s11_n) \cdot e^{(2i \cdot \pi \cdot F_n) \cdot T}}{\text{cable\_gain}(F_n)}\right]$$

In the above equation, the variable $F_n$ is frequency and the variable T is time. The exponential rotation term, $e^{2i \cdot \pi \cdot f \cdot T}$ represents delay. S11 represents the reflection coefficient of the RPSD if measured without going through cable (as if measured at the RPSD). In the frequency domain, exponential rotation term, $e^{2i \cdot \pi \cdot f \cdot T}$ has a major effect on the pattern of Return Loss versus frequency as the S11 connector Return Loss component interacts with other inherent Return Loss components in the system.

Figure 5:
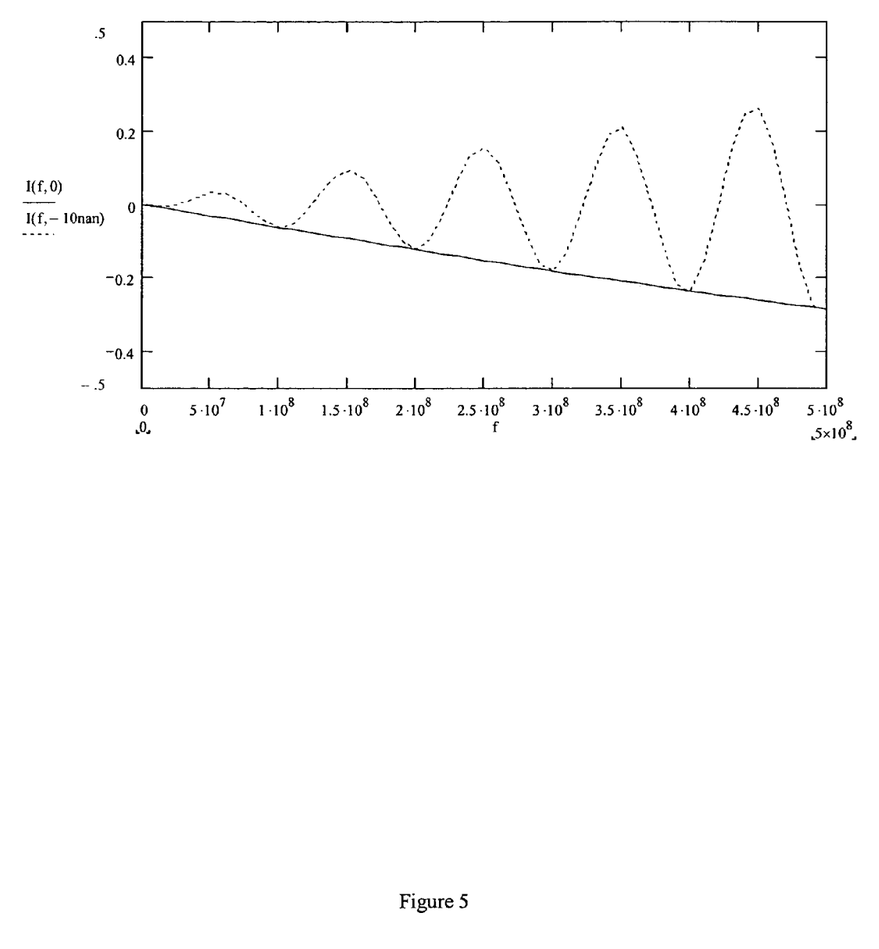
FIG. 5 illustrates a plot of the imaginary part of S11 versus frequency.

FIG. 5 shows a plot of the imaginary part of S11 vs. frequency when T is near zero. The straight curve depicts the case where there is no round trip delay and the oscillating curve is the S11 observed through a delay of 10 nanoseconds. If the amplitudes are added for a set of frequencies $F_n$, the result will be significant for the T=zero case because the amplitude is always negative and increasing with frequency in this case. At T=10 nanoseconds, the amplitude is rising and falling from positive values to negative values and the amplitude sum at each frequency would be reduced from that at T=zero. The frequency set from which the correction function is calculated is a subset of the measurement response data and may be evenly spaced by interpolation from the measured data points. The time function, T, will be a continuously variable function.

The following equation shows the summation of the imaginary part of S11 at selected frequencies, $F_n$. T is a time variable that is used in the search for the location of S11. (n) is an integer over the number of frequency steps.

$$\sum_{n=ns}^{nf} \text{Im}\left[\frac{(s11_n) \cdot e^{(2i \cdot \pi \cdot F_n) \cdot T}}{\text{cable\_gain}(F_n)}\right]$$

Figure 6:
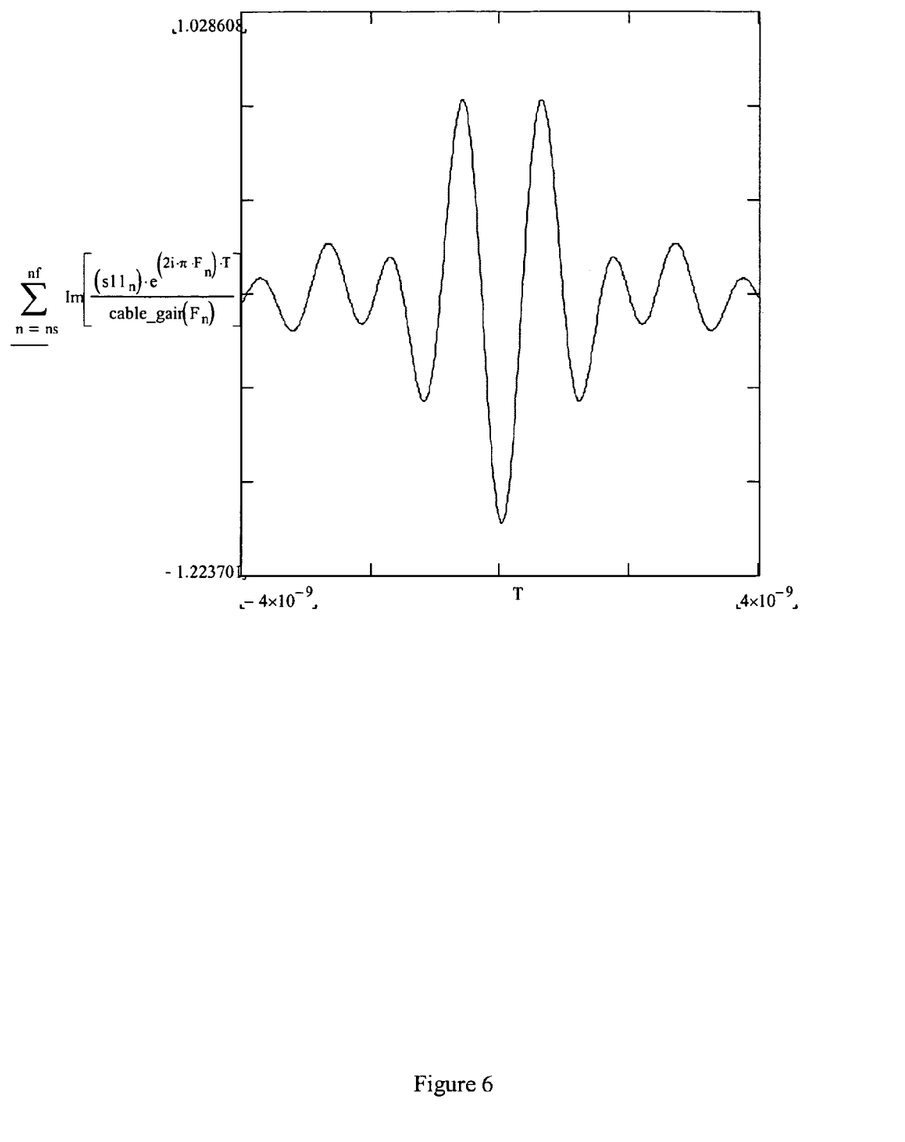
FIG. 6 illustrates a plot of the cable corrected summation of the imaginary part of S11 over a selected set of frequencies as a function of time.

As shown in FIG. 6, several peaks occur in a plot of this function with respect to time. A significant peak occurs near the RPSD location, which is at time zero in the example of FIG. 6.

Figure 7:
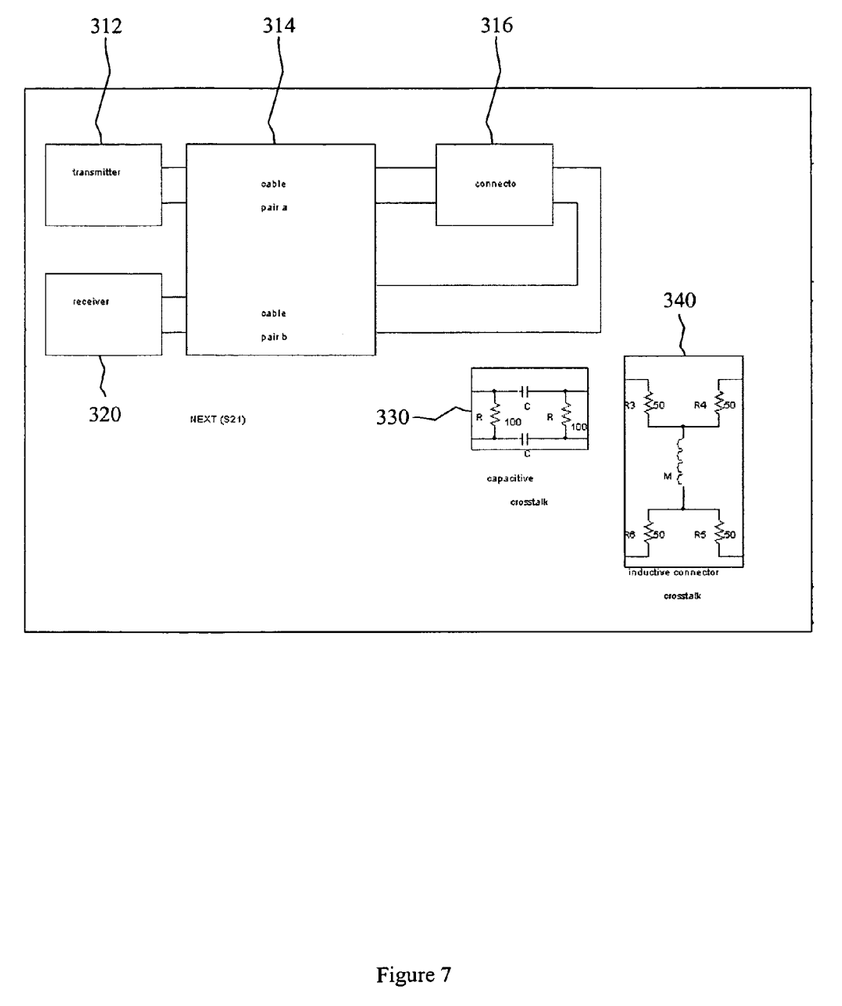
FIG. 7 illustrates two cable pairs connected to a connector for S21 measurement.

RPSDs from NEXT (S21) can be shown to have the same transfer functions of S11. The return path is through a different cable pair than the transmit path, but the response will have the same basic function. Therefore, the correction procedure is the same for NEXT as for Return Loss. FIG. 7 illustrates the signal path for NEXT. A signal is transmitted from a transmitter 312 to a receiver 320. The signal is sent into a cable 314, pair a, and travels through the cable 314, pair a, to a connector 316. The connector 316 may be modeled as capacitive crosstalk or inductive crosstalk as shown in model 330 for capacitive connector crosstalk and model 340 for inductive connector crosstalk. The crosstalk provides a path from cable 314, pair a, to cable 314, pair b. The total cable loss is the loss of cable 314, pair a, and the loss of cable 314, pair b.

One of skill in the art will be familiar with the "S" parameter equations for other types of RPSDs.

The location of the greatest peak in the graph in FIG. 6 (or in similar graphs for other types of RPSDs) corresponds to the location of an RPSD. This location can be found through a standard root-finding function or other well-known mathematical techniques. A peak of the function will occur where the first derivative of the function with respect to T is zero. Therefore a root can be found of the first derivative and the function magnitude examined to find a peak. This process is repeated for each root found and all peaks discarded except the greatest in magnitude in a limited search range near the expected delay time.

The area that is searched for a peak is greatly narrowed by first finding the approximate location of an RPSD. The root-finding function or other mathematical peak search technique is performed only near the approximate location of the RPSD. This greatly reduces the amount of computation needed to find the greatest peak compared to a case where the search area is the entire length of the cable 150.

The approximate location of the near-end RPSD 130 can be found through the factory specifications of the test device 115, as described above. The mathematical analysis is then performed on the function plotted in FIG. 6 to determine the location and amplitude of the greatest peak in the graph. When the peak with the greatest absolute value within the search area is found, the time at that point corresponds to the location of the correction for the near-end RPSD 130.

When these two parameters, the location of the near-end RPSD 130 correction and its equivalent reactance, are known, a correction function can be generated that replicates the effects of the near-end RPSD 130. A corrected test signal response can then be created by subtracting the correction function from the uncorrected test signal response at all frequencies of interest. The correction term at any frequency is found by the calculation of the function below for the variable f. This correction function is the same for NEXT and Return Loss.

$$\text{correction}(f) := \frac{1 \cdot i \cdot \text{peak} \cdot f \cdot \text{cable\_gain}(f)}{\left(\sum_{n=\text{ns}}^{nf} F_n\right)} \cdot e^{(-2 \cdot i \cdot \pi \cdot f \cdot T_p)}$$

Where:
f is frequency
n is summation increment
$F_n$ is the frequency set used for rotation
i is square root of –1
cable_gain(f) is cable gain magnitude as a function of frequency
peak is the magnitude of the peak found from peak finding routine
Tp is the location of the peak in time.

The corrected Return Loss and NEXT functions are shown below.

Return_Loss(f):=−20·log(|S11(f)−correction(f)|)

NEXT(f):=−20·log(|next(f)−correction(f)|)

The correction functions above will be unique because one is for correcting Return Loss and one is for correcting NEXT.

A similar procedure can be followed to remove the effects of the far-end RPSD 140. As with the near-end RPSD 130, an approximate location of the far-end RPSD 140 is first determined. Several standard methods are well known in the art for finding the approximate distance to the far-end RPSD 140. For example, an open circuit or other reflective impedance could be created at the far-end RPSD 140 and a test signal could be sent from the signal source 160 to the far-end RPSD 140. The open circuit would create a large reflected signal with a signature that would be easily recognizable. Standard techniques could then be used to find the approximate distance to the open circuit that created the large reflected signal. Other methods of finding the approximate distance to the far-end RPSD 140 will present themselves to one of skill in the art.

When the approximate location of the far-end RPSD 140 is known, the location and the amplitude of its equivalent reactance can be found using a mathematical analysis as described above. The mathematical analysis includes correcting for cable amplitude response and cable delay. As with the near-end RPSD 130, the mathematical analysis is performed only near the approximate location of the far-end RPSD 140.

A correction function for the far-end RPSD 140 is then created using the location and amplitude of the reactance of the far-end RPSD. 140 along with the cable amplitude response. The correction function can be subtracted from the test signal response that has already been corrected for the near-end RPSD 130. Alternately, corrections for both the near-end RPSD 130 and the far-end RPSD 140 may be made at the same time. In this way, the effects of both the near-end RPSD 130 and the far-end RPSD 140 are effectively removed from the test signal response and only the channel 155 portion of the cable 150 is tested.

If there are RPSDs on the channel 155 between the near-end RPSD 130 and the far-end RPSD 140, they could be found through a similar procedure. However, since their approximate locations would typically not be known, the mathematical analysis to find their exact locations would have to be done over the entire length of the channel 155. Such an analysis would be time consuming and would require a large amount of calculation. Alternatively, a technique such as an inverse Fourier transform for finding their approximate locations could first be used to narrow the search area over which the mathematical analysis is performed. Once the locations and reactance magnitudes of all RPSDs on the cable 150 are known, if desired, correction functions for all of them can be generated. The cable gain to the RPSD would need to be approximated based on the length to the RPSD and the known cable gain to the far end. The correction term would then be subtracted from a test signal response to create a corrected test signal response.

The determination of the appropriate reflection components and the appropriate peaks, the correlation of the peaks to a location and a reactance magnitude for an RPSD, and the generation of a correction function based on the location and reactance magnitude can be performed by an analysis component 170 within the test device 115. The analysis component 170 may be an integrated unit that is capable of performing all of the functions needed to generate a correction function for an RPSD. Alternatively, separate components may perform some of these functions. For example, the analysis component 170 might determine the appropriate reflection components and determine the appropriate peaks. A separate component might correlate the peaks to a location and a reactance magnitude for an RPSD. Yet another component might generate a correction function based on the location and reactance magnitude. In other embodiments, other combinations of components might perform other combinations of these functions.

Figure 8:
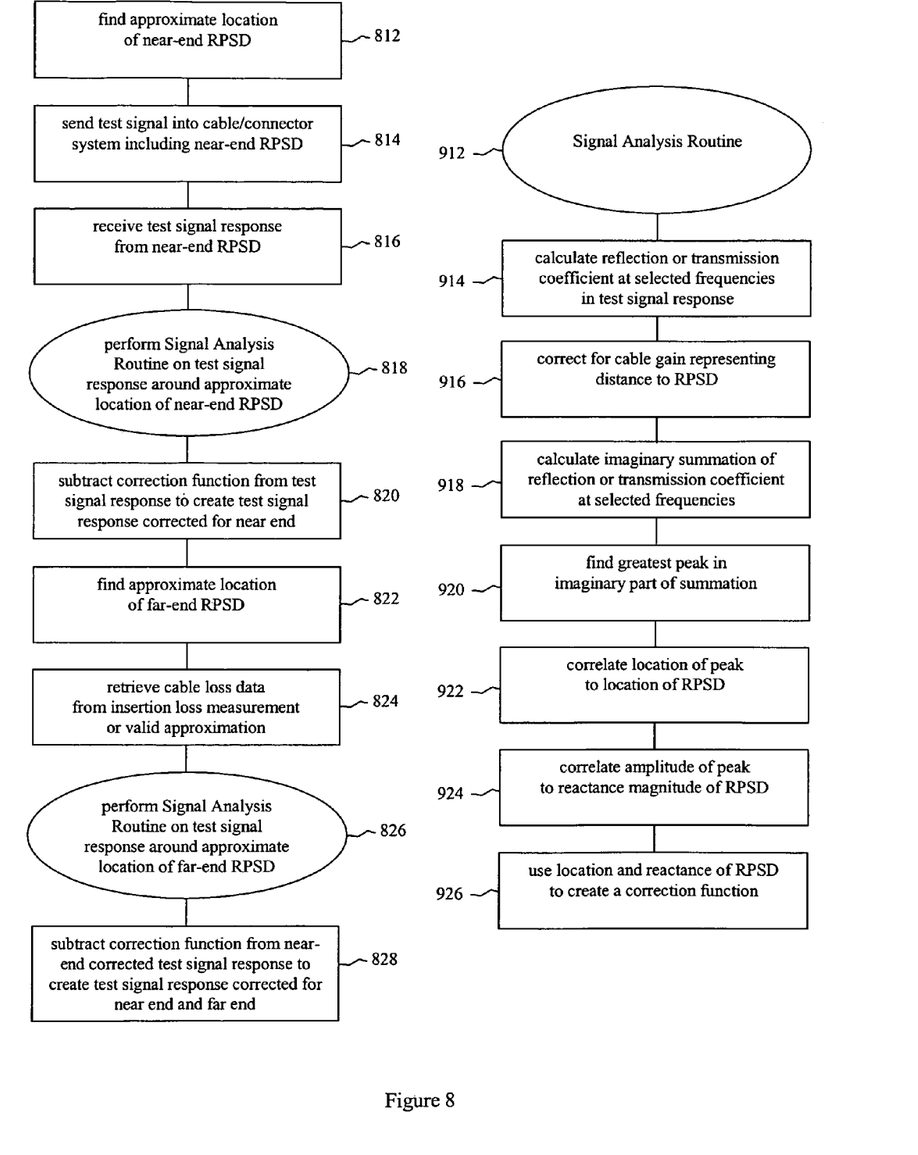
FIG. 8 illustrates a method for canceling the effects of reactive point source disturbances in a data communication cable, according to an embodiment of the invention.

FIG. 8 summarizes the present method for canceling the effects of near-end and far-end RPSDs. In box 812, the approximate location of the near-end RPSD is found. The approximate distance from a signal source to the near-end RPSD would typically be known from the specifications of the test device to which the near-end RPSD is coupled. This step does not necessarily need to occur at this point in the flow. For example, the approximate location of the near-end RPSD could be found after a test signal response is received in box 816.

In box 814, a test signal with a varying frequency is transmitted into a cable/connection system that includes the RPSDs. A test signal response reflected from the near-end RPSD is received in box 816. In box 818, the method flow is switched to a signal analysis routine 912. The signal analysis routine 912, which consists of boxes 914 through 924, is performed on the test signal response around the approximate location of the near-end RPSD.

In box 914, a reflection coefficient or transmission coefficient is calculated at selected frequencies in the test signal response. In box 916, a correction is made for cable gain representing the distance to the RPSD. In box 918, a summation is made of the cable gain-corrected imaginary part of the reflection coefficient or transmission coefficient at selected frequencies in the test signal response. In box 920, the greatest peak in the imaginary part of the summation is found. In box 922, the location of the peak is correlated to the location of the RPSD. In box 924, the amplitude of the peak is correlated to the magnitude of the reactance of the RPSD. In box 926, the location and reactance magnitude of the RPSD are used to create a correction function for the RPSD.

The creation of the correction function completes the signal analysis routine 912. The method flow then returns to box 820, where the correction function for the near-end RPSD is subtracted from the test signal response to create a corrected test signal response. Alternatively, the subtraction of the correction function could be done in box 828.

In box 822, the approximate location of the far-end RPSD is found. The approximate distance to the far-end RPSD can be found through well-known techniques, such as creating an open circuit at the far-end RPSD and analyzing a signal reflected from the open circuit. This step does not necessarily need to occur at this point in the flow and could occur when the approximate location of the near-end RPSD is found in box 812, for example.

In box 824, cable loss data might be retrieved from an insertion loss measurement or a valid approximation. In box 826, the method flow is switched again to the signal analysis routine 912, where a correction function for the far-end RPSD is found. When the signal analysis routine 912 is complete, the method flow returns to box 828, where the correction function for the far-end RPSD is subtracted from the corrected test signal response. If the correction function for the near-end RPSD was not subtracted in box 820, it could be subtracted in box 828. The subtractions of the correction functions for the near-end RPSD and the far-end RPSD create a test signal response that is corrected for both the near-end RPSD and the far-end RPSD.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein, but may be modified within the scope of the appended claims along with their full scope of equivalents. For example, the various elements or components may be combined or integrated in another system or certain features may be omitted, or not implemented.

Also, techniques, systems, subsystems, and methods described and illustrated in the various embodiments as discrete or separate may be combined or integrated with other systems, modules, techniques, or methods without departing from the scope of the present disclosure. Other items shown as directly coupled or communicating with each other may be coupled through some interface or device, such that the items may no longer be considered directly coupled to each but may still be indirectly coupled and in communication with one another. Other examples of changes, substitutions, and alterations are ascertainable by one skilled in the art and could be made without departing from the spirit and scope disclosed herein.

I claim:

1. A device for testing data communications cabling, comprising:
    a signal generator that generates a test signal to test the data communications cabling; and
    a component that receives a reflected signal produced by reflection of the test signal from the data communications cabling including at least one reactive point source disturbance, the component further determines characteristics of the reflected signal by analyzing a phase rotation of the reflected signal,
    wherein said characteristics comprise the location of the at least one reactive point source disturbance.

2. The device of claim 1, further comprising a cancellation generator that generates a cancellation function based on the characteristics of the reflected signal, the cancellation function substantially negates a portion of the reflected signal.

3. A method for canceling the effects of a reactive point source disturbance, comprising:
    identifying an approximate location of the reactive point source disturbance;
    sending a varying-frequency test signal to a cabling system that includes the reactive point source disturbance;
    receiving a test signal response from the cabling system;
    determining characteristics of the test signal response near the approximate location of the reactive point source disturbance by analyzing a phase rotation of the test signal response;
    determining a cable gain to and from the reactive point source disturbance;
    generating a first correction function for the reactive point source disturbance based on the characteristics of the test signal response and one of a measured and an approximated cable gain; and
    subtracting the first correction function from the test signal response to create a first corrected test signal response that substantially cancels the effects of the reactive point source disturbance.

4. The method of claim 3, wherein the reactive point source disturbance is a near-end connector coupled to a device that generates the varying-frequency test signal.

5. The method of claim 4, further comprising:
    identifying an approximate location of a far-end connector;
    determining characteristics of the test signal response near the approximate location of the far-end connector;
    generating a second correction function for the far-end connector based on the characteristics of the test signal response and the measured cable gain; and
    subtracting the second correction function from the first corrected test signal response to create a second corrected test signal response that substantially cancels the effects of the far-end connector.

6. The method of claim 5, wherein generating the second correction function comprises:
    determining a second imaginary summation of rotated S11 over selected frequencies in the test signal response;
    determining a second greatest absolute magnitude peak in the second imaginary summation;
    correlating a second greatest peak location to a far-end connector location;
    correlating a second greatest peak amplitude to a far-end connector reactance magnitude; and
    using the far-end connector location and the far-end connector reactance magnitude to generate the second correction function.

7. The method of claim 5, wherein identifying the approximate location of the far-end connector is based on an analysis of a signal reflected from a known impedance mismatch created at the far-end connector.

8. The method of claim 5, wherein the second correction function corrects for far-end connector Return Loss.

9. The method of claim 5, wherein the second correction function corrects for far-end connector near-end crosstalk.

10. The method of claim 4, wherein generating the first correction function comprises:
    determining a reflection coefficient at selected frequencies in the test signal response;
    determining a first imaginary summation of rotated S21 over selected frequencies from the test signal response;
    determining a first greatest absolute magnitude peak in the first imaginary summation;
    correlating a first greatest peak location to a near-end connector location;
    correlating a first greatest peak amplitude to a near-end connector reactance magnitude; and using the near-end connector location and the near-end connector reactance magnitude to generate the first correction function.

11. The method of claim 3, wherein identifying the approximate location of the reactive point source disturbance is based on a specification for a device that generates the varying-frequency test signal.

12. The method of claim 3, wherein the first correction function corrects for near-end connector near-end crosstalk.

13. The method of claim 3, wherein the first correction function corrects for near-end connector Return Loss.

14. A device for testing a data communication cable, comprising:
- a signal source that sends a test signal of varying frequency through the cable;
- an analysis component that receives a test signal response produced by a reflection of the test signal from the cable, determines a first set of reflection coefficients for the frequencies in the test signal response, determines a first imaginary summation over selected frequencies for the first set of reflection coefficients including correction for cable gain, and determines a first greatest peak in the first imaginary summation;
- a correlation component that correlates a first greatest peak location to a reactive point source disturbance location, and correlates a first greatest peak amplitude to a reactive point source disturbance reactance magnitude; and
- a generation component that uses the reactive point source disturbance location, the cable gain correction, and the reactive point source disturbance reactance magnitude to generate a reactive point source disturbance correction function, and further combines the reactive point source disturbance correction function with the test signal response to create a first corrected test signal response.

15. The device of claim 14, wherein the reactive point source disturbance is a near-end connector coupled to the device.

16. The device of claim 14, wherein the first greatest peak in the first imaginary summation is relative to a reactive point source disturbance approximate location approximated from a device specification.

17. The device of claim 16, wherein the analysis component determines a second set of reflection coefficients for the frequencies in the test signal response, determines a second imaginary summation, including correction for cable gain, over selected frequencies for the second set of reflection coefficients, and determines a second greatest peak in the second imaginary summation, and wherein the correlation component correlates a second greatest peak location to a far-end connector location and correlates a second greatest peak amplitude to a far-end connector reactance magnitude, and wherein the generation component uses the far-end connector location and the far-end connector reactance magnitude to generate a far-end connector correction function, and combines the far-end connector correction function with the first corrected test signal response to create a second corrected test signal response.

18. The device of claim 17, wherein the second greatest peak in the second imaginary summation is sought only near a far-end connector approximate location approximated through an analysis of a far-end connector test signal reflected from a known impedance created at the far-end connector.

19. The device of claim 18, wherein the second corrected test signal response is analyzed to test the data communication cable.

20. The device of claim 18, wherein the far-end connector correction function corrects for at least one of Return Loss and near-end crosstalk of the far-end connector.

21. The device of claim 14, wherein the reactive point source disturbance correction function corrects for at least one of near-end crosstalk and Return Loss for the near-end connector.

* * * * *

UNITED STATES PATENT AND TRADEMARK OFFICE
CERTIFICATE OF CORRECTION

PATENT NO. : 7,400,151 B2  
APPLICATION NO. : 11/188534  
DATED : July 15, 2008  
INVENTOR(S) : Gerald Wayne Beene Page 1 of 1

It is certified that error appears in the above-identified patent and that said Letters Patent is hereby corrected as shown below:

Col. 4, line 2, replace "$x \to xe^{i\theta}$" with $z \to ze^{i\theta}$

Signed and Sealed this

Eighteenth Day of November, 2008

JON W. DUDAS  
*Director of the United States Patent and Trademark Office*